United States Patent
Byrn et al.

(10) Patent No.: US 7,103,858 B2
(45) Date of Patent: Sep. 5, 2006

(54) PROCESS AND APPARATUS FOR CHARACTERIZING INTELLECTUAL PROPERTY FOR INTEGRATION INTO AN IC PLATFORM ENVIRONMENT

(75) Inventors: Jonathan W. Byrn, Kasson, MN (US); Robert M. Biglow, Rochester, MN (US)

(73) Assignee: LSI Logic Corporation, Milpitas, CA (US)

( * ) Notice: Subject to any disclaimer, the term of this patent is extended or adjusted under 35 U.S.C. 154(b) by 106 days.

(21) Appl. No.: 10/824,509

(22) Filed: Apr. 14, 2004

(65) Prior Publication Data

US 2005/0235244 A1    Oct. 20, 2005

(51) Int. Cl.
*G06F 17/50* (2006.01)
(52) U.S. Cl. ............................................. 716/3; 716/18
(58) Field of Classification Search .................... 716/3, 716/18

See application file for complete search history.

(56) References Cited

U.S. PATENT DOCUMENTS

| | | | |
|---|---|---|---|
| 5,535,134 A | 7/1996 | Cohn et al. | |
| 6,014,506 A | 1/2000 | Hossain et al. | |
| 6,134,702 A | 10/2000 | Scepanovic et al. | |
| 6,189,132 B1 | 2/2001 | Heng et al. | |
| 6,292,929 B1 | 9/2001 | Scepanovic et al. | |
| 6,415,425 B1 | 7/2002 | Chaudhary et al. | |
| 6,536,030 B1 * | 3/2003 | Tanaka | 716/17 |
| 6,637,016 B1 | 10/2003 | Gasanov et al. | |
| 6,650,046 B1 | 11/2003 | Shirakawa et al. | |
| 6,725,432 B1 * | 4/2004 | Chang et al. | 716/4 |
| 6,748,574 B1 | 6/2004 | Sasagawa et al. | |
| 6,968,514 B1 * | 11/2005 | Cooke et al. | 716/1 |
| 2003/0163795 A1 | 8/2003 | Morgan et al. | |
| 2003/0188274 A1 | 10/2003 | Gasanov et al. | |
| 2004/0166864 A1 | 8/2004 | Hill et al. | |
| 2005/0038728 A1 | 2/2005 | La Mura | |
| 2005/0091625 A1 | 4/2005 | Andreev et al. | |

OTHER PUBLICATIONS

U.S. Appl. No. 10/688,460, filed Oct. 17, 2003, Process and Apparatus for Fast Assignment of Objects to a Rectangle (22 pages).
U.S. Appl. No. 10/694,208, filed Oct. 27, 2003, Process and Apparatus for Placement of Cells in an IC During Floorplan Creation (26 pages).

\* cited by examiner

*Primary Examiner*—Vuthe Siek
*Assistant Examiner*—Tuyen To
(74) *Attorney, Agent, or Firm*—Eric J. Whitesell

(57) ABSTRACT

A footprint based optimal characterization of intellectual property (IP) for more deterministic physical integration. The physical integration characteristics are based upon IP physical integration at an anchor point in a pre-defined IC platform. IP footprint characteristics are identified as fixed, variable or prioritized to each other, and bounding constraints are defined based on a set of characteristics for the IP, the platform characteristics and IC design requirements. The IP is physically synthesized using the bounding constraints. The synthesized IP is tested and the bounding constraints are iteratively modified until the characteristics of the synthesized IP are optimized/captured.

12 Claims, 3 Drawing Sheets

PROCESS AND APPARATUS FOR CHARACTERIZING INTELLECTUAL PROPERTY FOR INTEGRATION INTO AN IC PLATFORM ENVIRONMENT

FIELD OF THE INVENTION

This invention relates to design of integrated circuits and particularly to characterization of intellectual property for integration into an IC platform.

BACKGROUND OF THE INVENTION

Integrated circuits are used in a wide range of electronic devices produced by a large number of device manufacturers. In practice, ICs are seldom manufactured (fabricated) by the electronic device manufacturer. Instead ICs are manufactured by an IC foundry to the specifications of the electronic device manufacturer. The design of the IC is usually the result of collaboration between the device manufacturer and the IC foundry.

The design and manufacture of an application-specific IC, or ASIC, is usually a long, highly detailed and intensive process, requiring development of a hardware description language (HDL) description of the design, usually in a synthesizable register transfer language (synthesizable RTL), synthesizing the RTL description to a technology library of components, specifying the placement of those components on the silicon platform or on the ASIC die, specifying the physical interconnection of those components, closing the required physical specifications such as functional timing power, area, etc., inserting circuits for manufacturing test, taping out the design, fabricating the circuit into a physical IC chip and testing the chip. Often, tests reveal that re-design is necessary to meet objectives, thereby requiring the process be repeated. The process is time consuming and costly.

To reduce the time and cost of development of ASICs, IC foundries have developed standard, or base, platforms containing silicon layers of an IC, but without some or all of the metal interconnection layers. The silicon layers are configured with metal interconnection into gates that can be configured into cells using tools supplied or specified by the IC foundry. The chip designer specifies designs that are realized using the supplied or specified tools through the addition of additional metal layers for the base platform. This effectively configures the chip into a custom ASIC employing the customer's circuit design and other intellectual property (IP). The IC foundry ordinarily supplies or specifies tools to the IC designer to enable the designer to quickly and accurately configure the base platform to a custom ASIC compatible with the foundry's fabrication technology. An example of such a configurable base platform is the RapidChip® platform available from LSI Logic Corporation of Milpitas, California. The RapidChip platform permits the development of complex, high-density ASICs in minimal time with significantly reduced design iteration, turn around time, manufacturing risks and costs.

One problem in any silicon development process is the effective physical integration of IP. IP is typically developed without regard to the specifics of the physical environment where it will eventually reside. A current approach is to apply margins to the design in hopes that they can be traded off during the physical integration process. One problem with this is that margins are often not representative of the actual problems incurred during physical integration. The result of this is that the physical integration of IP into the IC can be a highly iterative process in a very expensive, time consuming and late portion of the design process.

Each piece of IP has a set of physical characteristics that are associated with it. What is important for one piece of IP may not be for another piece of IP. Consequently, the set of characteristics that are important for one IP may be different from the set of characteristics that are important for another IP.

For example an IP circuit dealing with a defined protocol that operates at a specific frequency must operate at that frequency or it is of no use. However another piece of IP may be useful over a variety of frequency ranges. These frequency ranges are application specific. Other characteristics that may be important to a given IP include area, metal utilization, porosity, congestion etc. This example is illustrative only and there are numerous additional possible characteristics.

The context of a piece of IP is important when physically integrating the IP into a chip design. The context defines how the IP is driven in the chip design and how the characteristics of the integrated (placed) IP affect the IC design. The context is based in part on a specific positioning of the IP in the IC, and different positions for the IP may produce different contexts. Thus, one significant issue is whether or not the IP specific physical requirements can be met, given the context of a physical placement. Another significant issue is the effect that this piece of IP places upon the rest of the design given this context.

It is often the case that changes to the design must be made to achieve the physical implementation that is required. The changes can come in a variety of forms that range from architectural redesign in the RTL stage to altering the physical placement of the design. Any of the alternatives within this continuum of options can lead to multiple expensive iterations and delays.

Designers do not always take into account the environment in which the IP will be placed. For example, a piece of IP that can be placed in an area X if sufficient wiring levels and porosity are available might require a greater area if the IC includes a high content of memory, processor and/or other physical obstructions. Therefore, additional elements must be considered to define the context in which the IP will be used. Moreover, the importance of these elements may vary depending upon the context. Therefore, there is a need for a technique to characterize IP for physical integration into an IC and to selectively define the importance of elements of the characteristics for a given context.

SUMMARY OF THE INVENTION

The present invention is directed to a technique to characterize the footprint of the IP for the platform environment, and particularly to characterize the IP to the physical characteristics important to the platform for easier and more deterministic integration of the IP to the platform.

In one embodiment of the invention, intellectual property (IP) defining a circuit for integration at an anchor point in a context pre-defined IC platform or ASIC is characterized. The IP footprint characteristics are identified as fixed, variable or prioritized to each other. Bounding constraints for the IP are defined based on a set of bounding constraint characteristics for the IP footprint and the platform characteristics. The IP is then physically synthesized using the bounding constraints and the synthesized IP is tested. An iterative process of modifying the bounding constraints, rerunning physical synthesis and testing is performed until the characteristics of the IP are identified for each anchor point.

In some embodiments, a plurality of anchor points are selected for a given platform. The process is repeated for each anchor point. The resulting footprint information can be used to facilitate the integration of the IP at or near an anchor point.

In another embodiment of the invention, a computer usable medium has a computer readable program embodied therein for addressing data to characterize intellectual property (IP) defining a circuit for integration at an anchor point in a pre-defined IC platform. The computer readable program comprises computer readable program code for causing the computer to perform the process of the invention.

DETAILED DESCRIPTION OF THE
PREFERRED EMBODIMENTS

Figure 1:
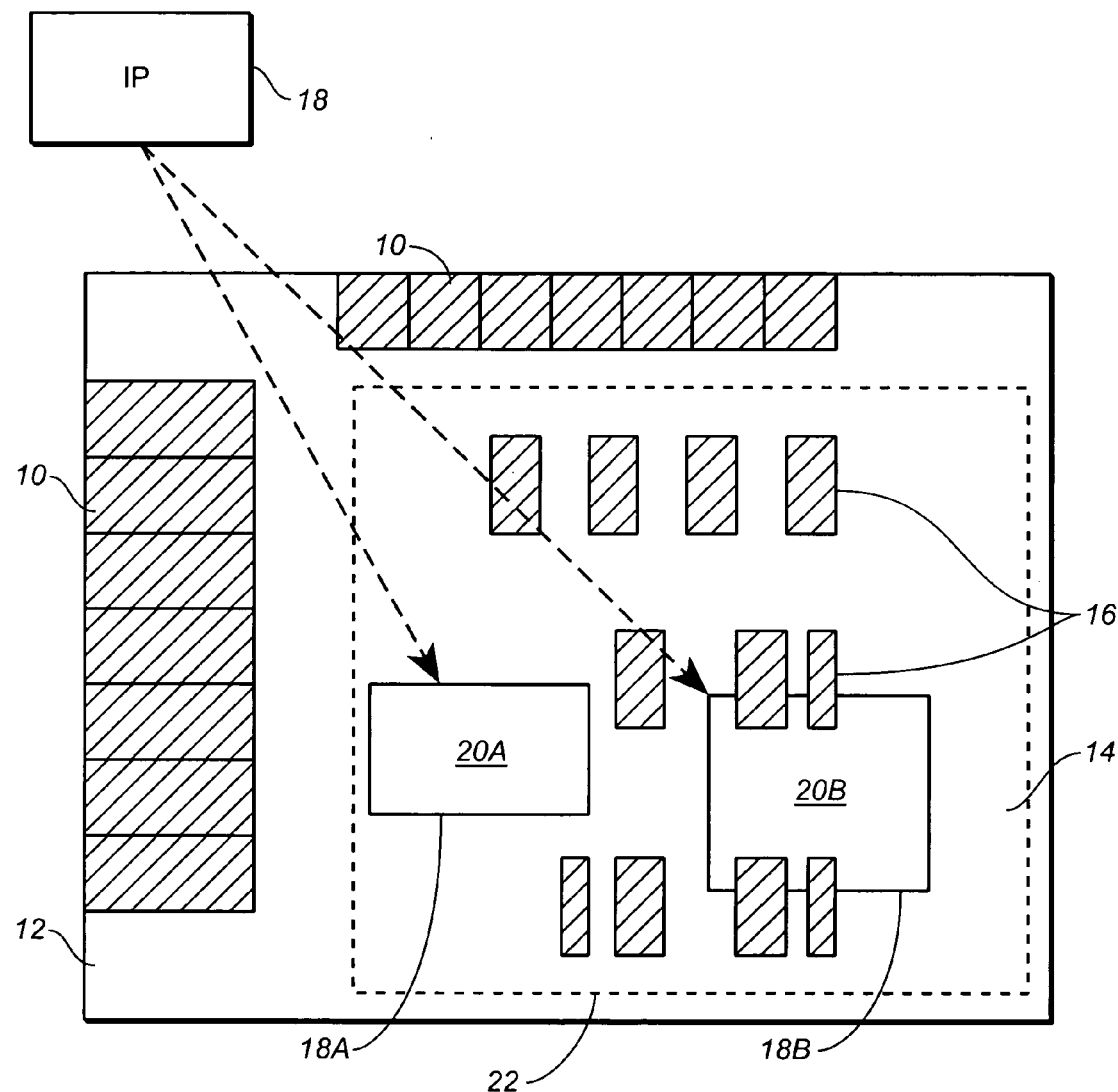
FIG. 1 is a plan view of a footprint of a base platform useful to explain portions of the invention.

FIG. 1 illustrates a typical silicon platform having a plurality of I/O cells 10, and one or more regions 12 of blockage. This leaves a region 14 into which cells, including cells of the IP, may be created from gates already present. Often region 16 includes predefined and placed megacells such as memories and processors and the like 16.

Consider a piece of IP 18 which, when characterized at anchor point 20A, achieves an area footprint 18A as illustrated in FIG. 1. At this anchor point it is clear of all megacells 16. If the same IP 18 is placed at anchor point 20B, it achieves a different area footprint 18B. The footprint at 18B must accommodate the context that it shares area with existing megacells 16. Intuitively, it would seem that the anchor point 20A is the better of the two anchor points for the placement of IP 18. However, connectivity and timing requirements between the IP and other elements of the design will determine which location, between anchor points 20A and 20B, is the better location. In either case the footprint may be used to help insure the correct reservation of in context resource to close the physical implementation of the design. This allows physical implementation issues, such as congestion, porosity, performance, area to be dealt with in a more deterministic fashion. The present invention is directed to a technique for characterizing or achieving the characteristics of the IP as an aid to its in context placement into the platform.

Figure 2:
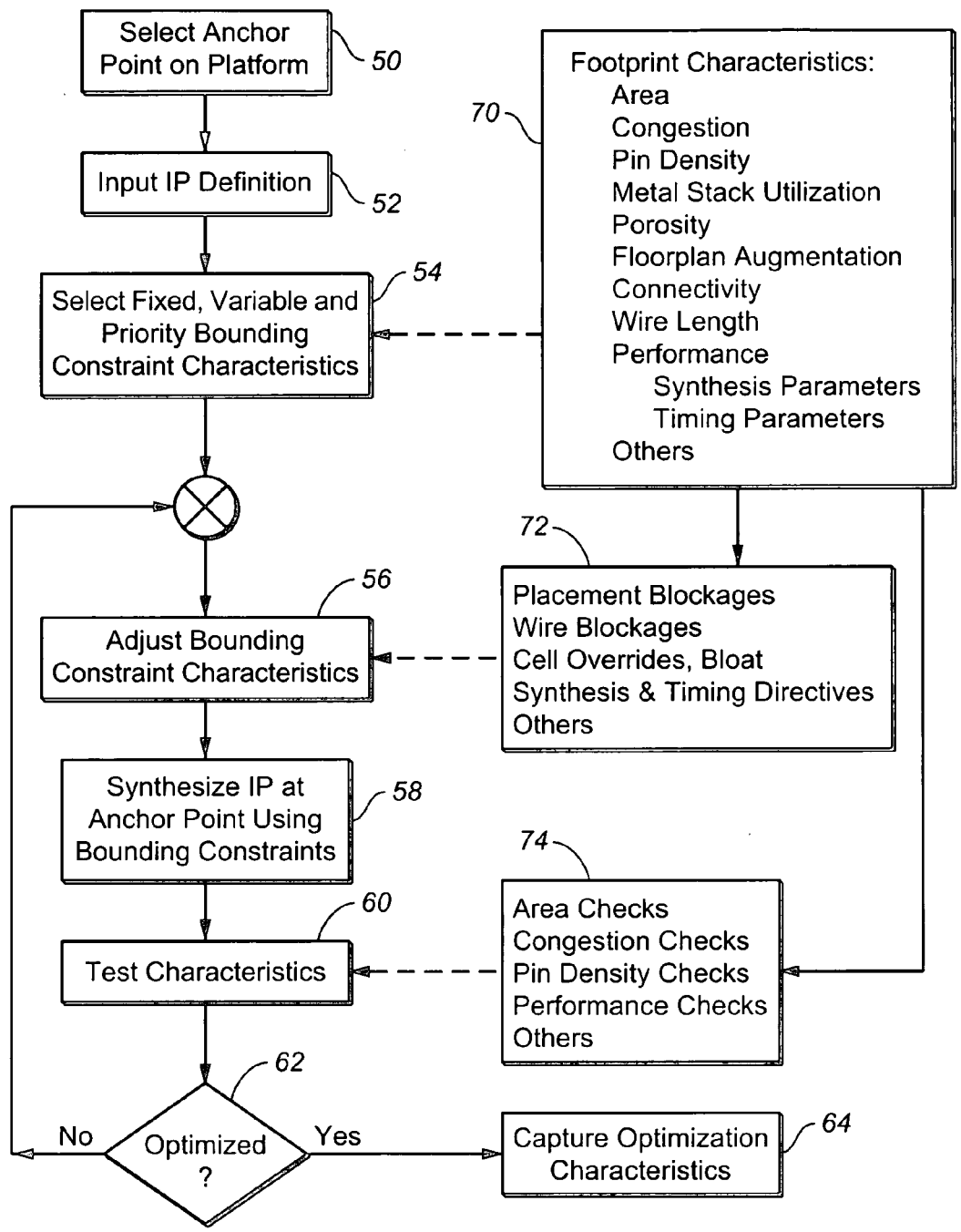
FIG. 2 is a flowchart of a process of identifying IP characteristics in accordance with an embodiment of the present invention.

FIG. 2 is a flowchart of a process in accordance with an embodiment of the present invention. In preferred embodiments, the process is carried out by a computer under the control of a program containing code recorded on a computer readable medium, such as a recording disk of a disk drive, and arranged so that the program code is readable by the computer to cause the computer to perform the steps of the process.

The process begins at step 50 with a selection of an anchor point on the platform, for example, anchor point 20A, shown in FIG. 1. At step 52, the IP definition is input.

The footprint characteristics are identified in list 70, including such characteristics as area, congestion, pin density, metal stack utilization, porosity, floorplan augmentation, connectivity, wire length, as well as performance requirements such as synthesis and timing parameters. List 70 is not an exhaustive list of characteristics, and other relevant characteristics may be included.

At step 54, each IP characteristic from list 70 is selected as fixed, variable or priority bounding constraints. In some cases a "don't care" status might be assigned to a given characteristic. The selection of the type of bounding constraint may be performed by the user, or may be generated based on context requirements of the platform and user input. For example, congestion might be a fixed bounding constraint that cannot exceed some user-defined predetermined level. Area might be a variable bounding constraint, meaning that it is permissible to adjust the area to meet other bounding constraints. Thus if congestion is a fixed bounding constraint having some maximum congestion threshold that cannot be exceeded, the area of the IP might be increased to reduce congestion to meet that threshold. However, some limit to the area might be defined by the platform. A priority bounding constraint is one where one characteristic has precedence over another, such as pin density vs. performance.

At step 56, bounding constraints for the IP are adjusted based on the footprint characteristics and the platform floorplan requirements from table 72. Examples of these characteristics include placement blockages, wire blockages, cell overrides, cell bloat, synthesis directives, timing directives and others. Thus at step 56, a set of bounds is defined for the characteristics. At step 58 the IP is physically synthesized at the selected anchor point using the bounding constraints. The physical synthesis step is a standard physical synthesis of the RTL well known in the art.

At step 60, the characteristics of the footprint are tested. More particularly, using the tests from list 74, the various characteristics of the IP are tested based on the synthesized design to identify if the parameters are met. For example, if the area has been increased to meet a maximal congestion level, the area might be tested to be certain that the IP does not exceed the specified area and/or the area of the chip.

If at step 62, the desired characteristics have been achieved and the remaining ones documented then characterization of the IP has been reached, the process continues to step 64 where the characteristics are captured or recorded for future use in the design process. If the required characteristics are not reached at step 62, the process returns to step 56 to adjust the bounding constraints of characteristics based on the test results. For example, if area is a variable bounding constraint the area of the IP might be adjusted at step 56 in a manner that is likely to improve the characteristics of those footprint characteristics that did not meet the requirements. For example, if during a given iteration the congestion is not satisfactory (that is, congestion was greater than some maximal limit), then at step 56 a variable bounding constraint, such as area, might be changed to relieve congestion of the IP. The process then continues through steps 58, 60 and 62 to identify whether satisfactory characterization has been reached. It will be appreciated that the process iterates through steps 56–62 until a satisfactory set of characteristics is identified and output at step 64.

Figure 3:
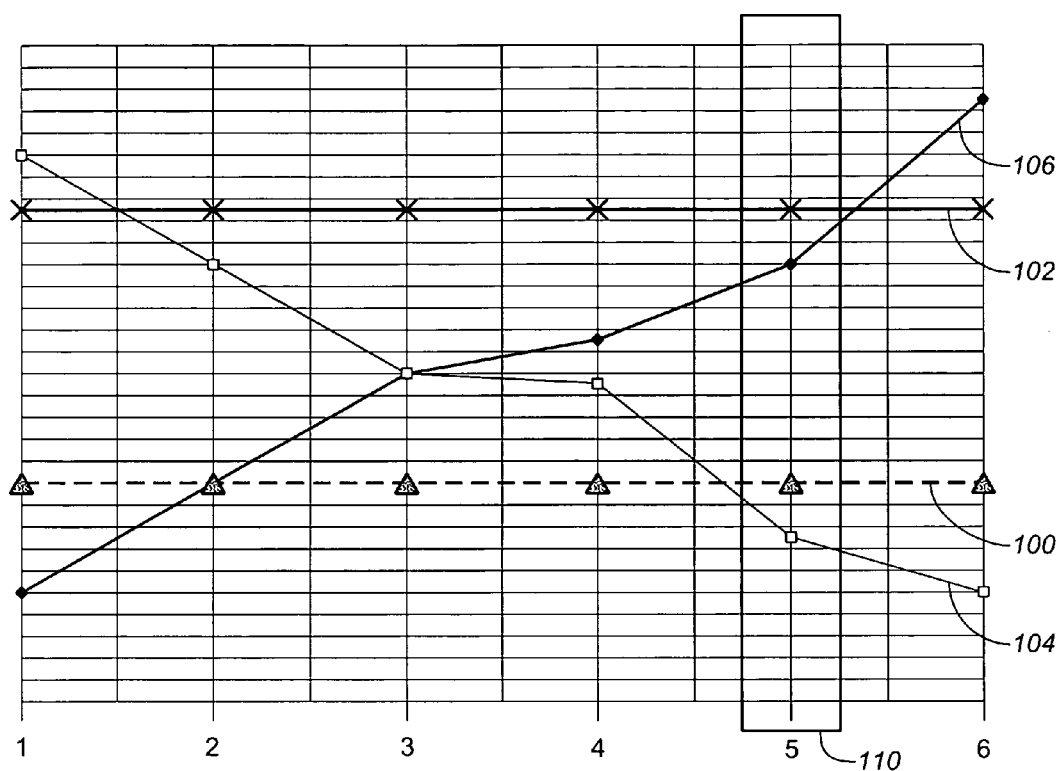
FIG. 3 is a graph useful in explaining operation of the process of FIG. 2.

In preferred embodiments, even if satisfactory results are achieved during a given iteration, the process continues through additional iterations to identify whether the characteristics can be improved or worsen. The characteristics are recorded at step 64 for each iteration, so that the iteration providing the best results are output. FIG. 3 illustrates this technique.

FIG. 3 is a graph illustrating the effect of each iteration of the process in connection with an IP whose footprint characteristics are being established and optimized for a platform in accordance with the present invention. In this case, congestion is assumed to be a fixed bounding constraint established by threshold 100. Area is a variable characteristic, limited by the area available for placement of the IP, such as defined by line 22 (FIG. 1), shown by threshold 102. The goal of this simple example is, therefore, to establish IP characteristics such that the congestion is below threshold 100, and the area does not exceed threshold 102. This is accomplished through several iterations of the process as plotted by curves 104 and 106.

Curve 104 illustrates the level of congestion, and curve 106 illustrates the area occupied by the IP, calculated for each iteration of the process. As shown in FIG. 3, each successive iteration enlarges the area (curve 106 increasing) while congestion decreases (curve 104). At the fifth iteration, curve 104 (congestion) has dropped below the maximal congestion level 100, while the area 106 has not exceeded the maximal area 102. Thus, as shown by block 110, the congestion and area characteristics are optimized for the IP under consideration as the values calculated at the fifth iteration of the process of FIG. 2.

It will be appreciated that the example of FIG. 3 is simplified, and that other factors, such as timing, wire length, etc., may also be affected as area is increased. Thus, as area increases, the distance between cells may increase, adversely affecting wire length Consequently, the goal is selection of a best case of satisfactory characteristics, thus being an optimal solution to the IP layout and placement at the anchor point.

In some embodiments, there are multiple sets of bounding constraints that can be considered. For example, a piece of IP might be characterized in the context of having two levels of metal available for physical integration, and then re-characterized in the context of having three or four levels of metal available for physical integration. A different set of characteristics will be identified for each context. This feature allows that a collection of footprint characteristics can be determined/achieved for the piece of IP, based on the different contexts for the number of levels of metal. Then, during actual integration of the IP into the platform or ASIC, the footprint used for physical integration could match a targeted context. Of course, the number of metal layers is just one of many constraints that might be varied to provide plural characterizations.

As previously described, the present invention is particularly useful to characterize non-edm developed IP intellectual property (IP), in the form of a physical integration footprint associated with a standardized platform to create a customer-specific ASIC. An IC foundry that provides such platforms often supplies several families of platforms designed for specific application classes, with numerous members in each family. Thus, in creating an ASIC or a customized platform with non-edm developed IP, a first step is to select a family of platforms and then select a likely platform from the family.

We have also found that the characteristics for a given piece of IP may translate well across members of a platform family. Therefore, should it become necessary to change to another platform of the same family for construction of the ASIC, it is probable that the overall placement may be maintained.

The anchor points, such as 20A and 20B in FIG. 1, are usually selected in some pattern on the platform. The pattern may be a grid pattern, or a modified grid pattern that considers existing features, such as megacells 16 (FIG. 1).

The process of FIG. 2 is then applied to each anchor point until optimal characterization parameters have been calculated for each anchor point.

During the creation of the design the IP will be logically and physically integrated. This characterization described may be used to more effectively physically integrate the IP into the design.

Although the present invention has been described with reference to preferred embodiments, workers skilled in the art will recognize that changes may be made in form and detail without departing from the spirit and scope of the invention.

What is claimed is:

1. A process for characterizing intellectual property (IP) defining a circuit for integration at an anchor point in a context pre-defined IC, comprising steps of:
   a) selecting a constraint on modification of each of a plurality of bounding constraints on physical characteristics of the IP;
   b) defining bounding constraints for each of the physical characteristics of the IP based on the context of the IC;
   c) physically synthesizing the IP using the bounding constraints;
   d) testing the physical characteristics of the synthesized IP;
   e) iteratively repeating steps b), c) and d) using the test results to modify the bounding constraints within the respective constraints of modification to improve the physical characteristics of the IP;
   (f) identifying a plurality of anchor points for the IP in the IC, and
   (g) repeating steps (b)–(e) for each anchor point.

2. The process of claim 1, wherein step (e) further comprises:
   repeating steps (b), (c) and (d) through a range of acceptable characteristics of the IP, and
   selecting a set of characteristics of the IP from the range.

3. The process of claim 2, wherein the constraint on modification of each bounding constraint is selected from the group comprising fixed, variable and priority relationship.

4. The process of claim 2, further comprising:
   f) storing the characteristics of the IP.

5. The process of claim 1, further comprising:
   f) storing the characteristics of the IP.

6. The process of claim 1, wherein the constraint on modification of each bounding constraint is selected from the group comprising fixed, variable and priority relationship.

7. A computer useable medium having a computer readable program embodied therein for addressing data to characterize intellectual property (IP) defining a circuit for integration at an anchor point in a context pre-defined IC platform, the computer readable program comprising:
   first computer readable program code for causing the computer to identify a constraint on modification of each of a plurality of bounding constraints on physical characteristics of the IP;
   second computer readable program code for causing the computer to define the bounding constraints on the characteristics of the IP based on the context of the IC platform;
   third computer readable program code for causing the computer to synthesize the IP using the bounding constraints;

fourth computer readable program code for causing the computer to test the physical characteristics of the synthesized IP;

fifth computer readable program code for causing the computer to iteratively repeat execution of the second, third and fourth computer readable program codes using results of execution of the fourth computer readable program code from the prior iteration to modify the bounding constraints within the respective constrains of modification to improve the physical characteristics of the IP sixth computer readable program code for causing the computer to identify a plurality of anchor points in the platform, and seventh computer readable program code for causing the computer to repeat execution of the second, third, fourth and fifth computer readable program codes for each anchor point.

8. The computer useable medium of claim 7, wherein the fifth computer readable program code further comprises:

computer readable program code for causing the computer to repeat execution of the second, third and fourth computer readable program codes through a range of acceptable characteristics of the IP, and computer readable program code for causing the computer to select a set of characteristics of the IP from the range.

9. The computer useable medium of claim 8, wherein the constraint on modification of each bounding constraint is selected from the group comprising fixed, variable and priority relationship.

10. The computer useable medium of claim 8, wherein the computer readable program further comprises:

computer readable program code for causing the computer to store the characteristics of the IP.

11. The computer useable medium of claim 7, wherein the computer readable program further comprises:

computer readable program code for causing the computer to store the characteristics of the IP.

12. The computer useable medium of claim 7, wherein the constraint on modification of each bounding constraint is selected from the group comprising fixed, variable and priority relationship.

* * * * *